United States Patent
Smoot et al.

(10) Patent No.: US 11,769,709 B2
(45) Date of Patent: Sep. 26, 2023

(54) INTEGRATED CIRCUIT WITH INTEGRALLY FORMED MICRO-CHANNEL OSCILLATING HEAT PIPE

(71) Applicant: ThermAvant Technologies, LLC, Columbia, MO (US)

(72) Inventors: Christopher D. Smoot, Columbia, MO (US); Joe Boswell, San Francisco, CA (US); Corey Wilson, Jefferson City, MO (US)

(73) Assignee: THERMAVANT TECHNOLOGIES, LLC, Columbia, MO (US)

( * ) Notice: Subject to any disclaimer, the term of this patent is extended or adjusted under 35 U.S.C. 154(b) by 0 days.

(21) Appl. No.: 15/830,522

(22) Filed: Dec. 4, 2017

(65) Prior Publication Data

US 2018/0158756 A1 Jun. 7, 2018

Related U.S. Application Data

(60) Provisional application No. 62/429,338, filed on Dec. 2, 2016.

(51) Int. Cl.
    *H01L 23/427* (2006.01)
    *F28D 15/04* (2006.01)
    *H01L 21/48* (2006.01)

(52) U.S. Cl.
    CPC ............ *H01L 23/427* (2013.01); *F28D 15/04* (2013.01); *H01L 21/4871* (2013.01)

(58) Field of Classification Search
    CPC ... H01L 23/427; H01L 23/473; H01L 23/467; H01L 23/45; H01L 23/3675; H01L 2225/06589; H01L 2225/1094; H01L 21/4871–7882; F28D 15/04
    See application file for complete search history.

(56) References Cited

U.S. PATENT DOCUMENTS

| | | | |
|---|---|---|---|
| 5,801,442 A | 9/1998 | Hamilton et al. | |
| 7,434,308 B2 | 10/2008 | Lu et al. | |
| 7,856,711 B2 | 12/2010 | Lu et al. | |
| 2006/0042825 A1* | 3/2006 | Lu ....................... | F28D 15/0266 257/E23.09 |
| 2014/0332949 A1* | 11/2014 | Davis .................... | H01L 23/473 257/712 |
| 2016/0043066 A1* | 2/2016 | Funabashi ........... | H01L 21/4882 165/185 |
| 2017/0179001 A1* | 6/2017 | Brunschwiler ..... | H01L 21/4871 |
| 2017/0257982 A1* | 9/2017 | Cheng ................ | H05K 7/20381 |
| 2018/0025962 A1* | 1/2018 | Dede .................... | H01L 29/2003 257/712 |

* cited by examiner

*Primary Examiner* — Brigitte A Paterson
(74) *Attorney, Agent, or Firm* — Sandberg Phoenix & von Gontard PC

(57) ABSTRACT

A miniaturized oscillating heat pipe (OHP) embedded within an integrated circuit (IC) is provided. The miniaturized oscillating heat pipe (OHP) integrally formed within an integrated circuit (IC) is fabricated to form a monolithic IC device using silicon (or similar future semiconductors) fabrication techniques. The OHP is operable to transfer high local heat fluxes within the IC device to more accessible locations on the IC device for heat rejection to an available heat sink.

13 Claims, 6 Drawing Sheets

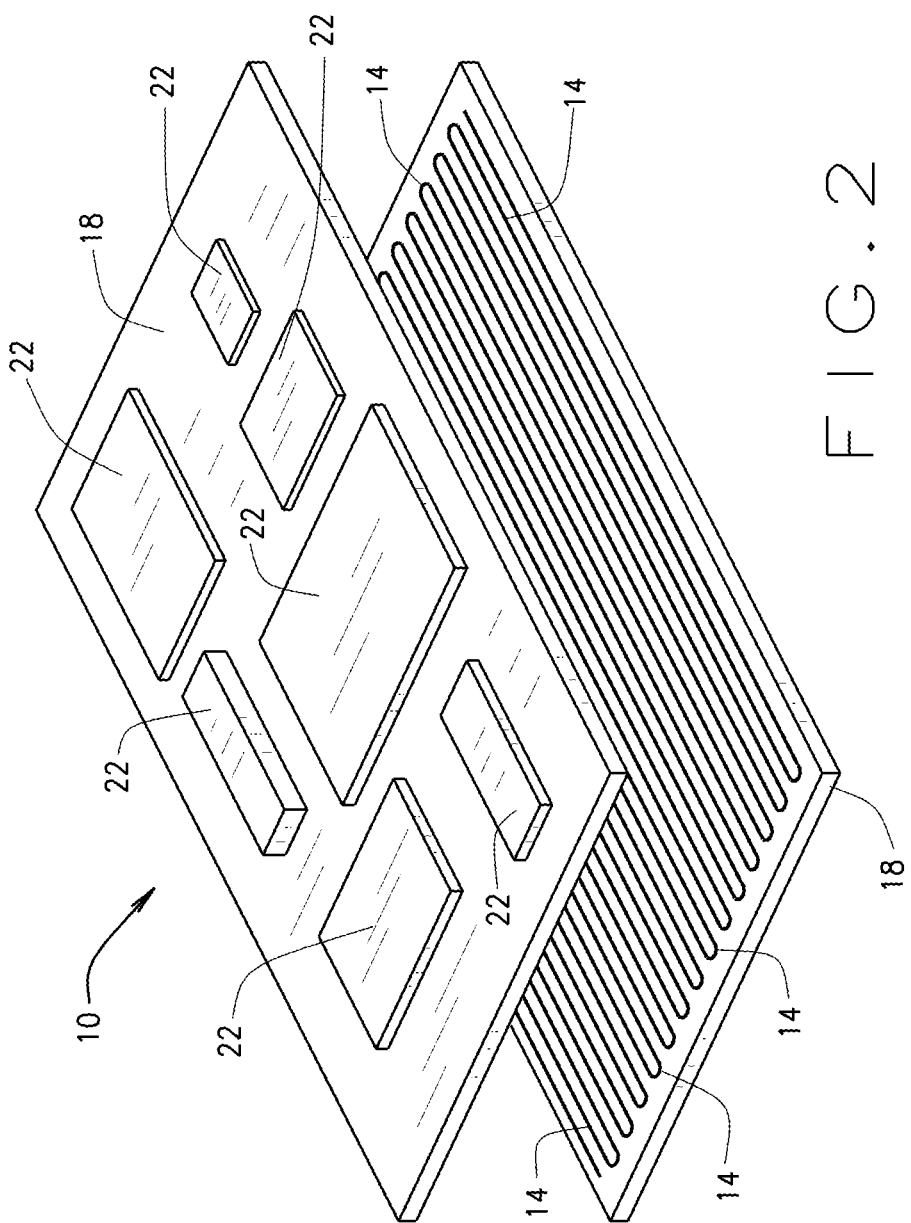

INTEGRATED CIRCUIT WITH INTEGRALLY FORMED MICRO-CHANNEL OSCILLATING HEAT PIPE

CROSS-REFERENCE TO RELATED APPLICATIONS

This application claims the benefit of U.S. Provisional Application No. 62/429,338, filed on Dec. 2, 2016. The disclosure of the above application is incorporated herein by reference in its entirety.

FIELD

The present teachings relate to integrated circuits, more particularly to integrated circuits with embedded oscillating heat pipes.

BACKGROUND

The statements in this section merely provide background information related to the present disclosure and do not constitute prior art.

Integrated circuits (IC) have continuously decreased in size since their inception. In the current state of the IC art processes are 14 nm and still shrinking, allowing billions of transistors to be placed on a single chip. As the number of transistors increases for a given surface area, the amount of heat generated also increases. Additionally, IC manufacturers are looking to increase the density of transistors per area by stacking layers to form three dimensional ICs. In such instances, the heat generation can be buried within the central layers, surrounded by materials with very poor thermal conductivity. Both approaches lead to small and difficult to access hot spots within the IC that are challenging to control with typical thermal management systems such as finned heat sinks.

Some research has explored the possibility implementing active cooling of integrated circuit device (IC) using a pumped fluid through micro-channels embedded into the semiconductor material. In such known devices the micro-channels are embedded in the substrate and a cooling liquid is forced or pumped though the channels. These systems typically have extreme pressure drops to overcome because of the small channel size. This in turn requires large and powerful pumps to supply the coolant. The extreme pressure also requires robust seals and structural integrity to prevent failures that could cause a leak within the circuitry. Other two phase systems, such as spray cooling, are difficult to implement in an electronics environment due to the dielectric requirements, the liquid return mechanism, and in particular with this application, the bulk size of the system. Such known active cooling systems and method have been attempted to implemented in both single substrate devices (e.g., sometimes referred to as a two-dimensional form factor devices) and in multi-layer substrate devices (e.g., sometimes referred to as three-dimensional form factor devices) that are built either modularly from multiple materials or monolithically from one material with the embedded micro-channels extending through such material layers for pumped fluid to pass through, and thus remove heat from the multiple layers of active IC elements.

Other known cooling techniques have attempted to use passive fluid cooling of integrated circuit (IC) devices using pulsating or oscillating heat pipes modularly built and added to the IC devices by sealing micro-channels on the non-active face of the semiconductor substrate material with a second interposer material that has matching micro-channels to form the characteristic oscillating heat pipe, which is then partially filled with a fluid that is hermetically sealed inside such micro-channels so that heat from the substrate's active elements is transferred to the interposer's heat sinking location(s).

Other known passive cooling systems and methods have been attempted to be implemented in a two-dimensional or three-dimensional form factor devices either modularly from multiple materials or monolithically from one material implementing through material vias (TMVs) made form solid state thermal conductors (e.g., Copper or carbon nano tubes) that rapidly move heat from elements on one layer to other layers where the heat is more readily rejected from the IC device.

SUMMARY

In various embodiments, the present disclosure provides a miniaturized oscillating heat pipe (OHP) that is embedded in an integrated circuit (IC) using silicon (or similar future semiconductors) fabrication techniques to transfer high local heat fluxes within the IC to more accessible locations for traditional heat transfer solutions.

This summary is provided merely for purposes of summarizing various example embodiments of the present disclosure so as to provide a basic understanding of various aspects of the teachings herein. Various embodiments, aspects, and advantages will become apparent from the following detailed description taken in conjunction with the accompanying drawings which illustrate, by way of example, the principles of the described embodiments. Accordingly, it should be understood that the description and specific examples set forth herein are intended for purposes of illustration only and are not intended to limit the scope of the present teachings.

DRAWINGS

The drawings described herein are for illustration purposes only and are not intended to limit the scope of the present teachings in any way.

FIG. 2 is an exemplary isometric view of the integrated circuit device shown in FIG. 1 having a substrate of the device sectioned to illustrate the OHPs provided, or formed, within the substrate, in accordance with various embodiments of the present disclosure.

Corresponding reference numerals indicate corresponding parts throughout the several views of drawings.

DETAILED DESCRIPTION

Figure 1:
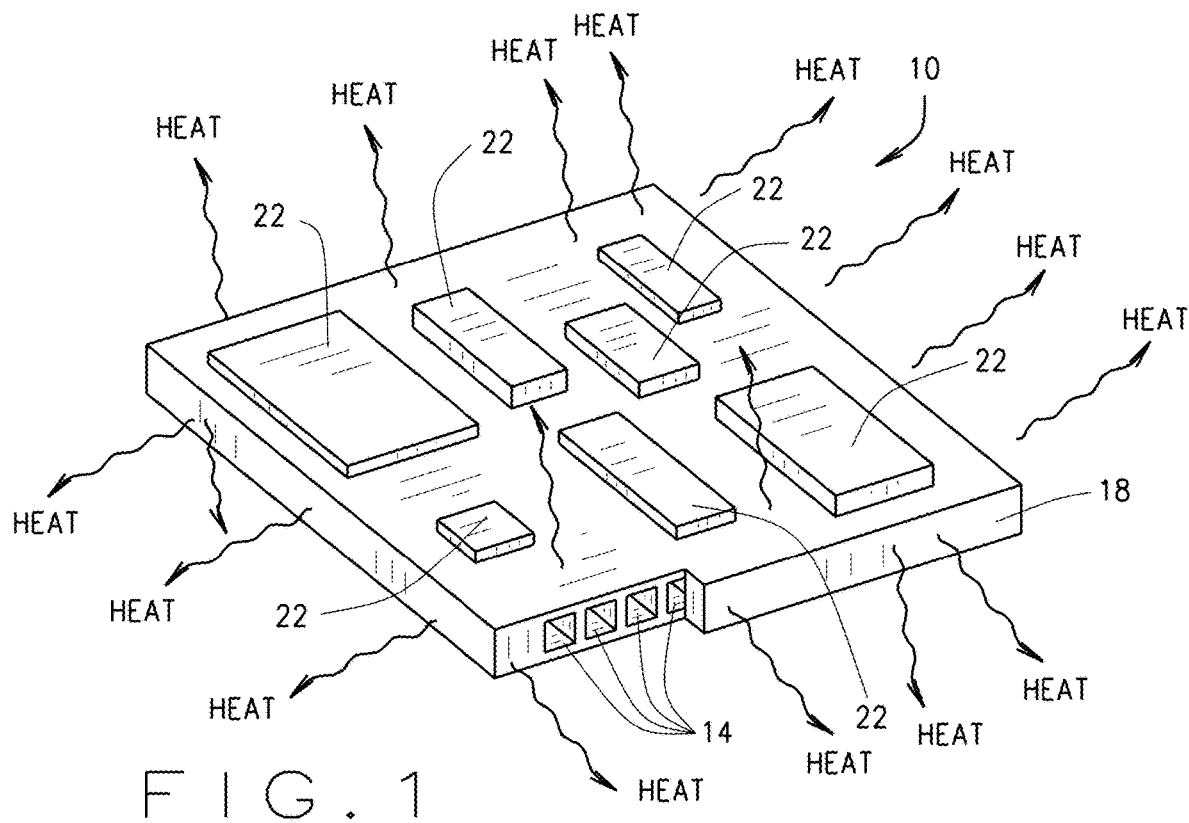
FIG. 1 is an isometric view of an exemplary integrated circuit device having a portion removed to show miniaturized oscillating heat pipes (OHPs) integrally formed, therein, in accordance with various embodiments of the present disclosure.

The following description is merely exemplary in nature and is in no way intended to limit the present teachings, application, or uses. Throughout this specification, like reference numerals will be used to refer to like elements. Additionally, the embodiments disclosed below are not intended to be exhaustive or to limit the invention to the precise forms disclosed in the following detailed description. Rather, the embodiments are chosen and described so that others skilled in the art can utilize their teachings. As well, it should be understood that the drawings are intended to illustrate and plainly disclose presently envisioned embodiments to one of skill in the art, but are not intended to be manufacturing level drawings or renditions of final products and can include simplified conceptual views to facilitate understanding or explanation. As well, the relative size and arrangement of the components can differ from that shown and still operate within the spirit of the invention.

As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims.

Unless otherwise defined, all technical and scientific terms used herein have the same meaning as commonly understood by one of ordinary skill in the art to which this disclosure belongs. The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps can be employed.

When an element, object, device, apparatus, component, region or section, etc., is referred to as being "on," "engaged to or with," "connected to or with," or "coupled to or with" another element, object, device, apparatus, component, region or section, etc., it can be directly on, engaged, connected or coupled to or with the other element, object, device, apparatus, component, region or section, etc., or intervening elements, objects, devices, apparatuses, components, regions or sections, etc., can be present. In contrast, when an element, object, device, apparatus, component, region or section, etc., is referred to as being "directly on," "directly engaged to," "directly connected to," or "directly coupled to" another element, object, device, apparatus, component, region or section, etc., there may be no intervening elements, objects, devices, apparatuses, components, regions or sections, etc., present. Other words used to describe the relationship between elements, objects, devices, apparatuses, components, regions or sections, etc., should be interpreted in a like fashion (e.g., "between" versus "directly between," "adjacent" versus "directly adjacent," etc.).

As used herein, the term "and/or" includes any and all combinations of one or more of the associated listed items. For example, A and/or B includes A alone, or B alone, or both A and B.

Although the terms first, second, third, etc. can be used herein to describe various elements, objects, devices, apparatuses, components, regions or sections, etc., these elements, objects, devices, apparatuses, components, regions or sections, etc., should not be limited by these terms. These terms may be used only to distinguish one element, object, device, apparatus, component, region or section, etc., from another element, object, device, apparatus, component, region or section, etc., and do not necessarily imply a sequence or order unless clearly indicated by the context.

Moreover, it will be understood that various directions such as "upper", "lower", "bottom", "top", "left", "right", "first", "second" and so forth are made only with respect to explanation in conjunction with the drawings, and that components may be oriented differently, for instance, during transportation and manufacturing as well as operation. Because many varying and different embodiments may be made within the scope of the concept(s) herein taught, and because many modifications may be made in the embodiments described herein, it is to be understood that the details herein are to be interpreted as illustrative and non-limiting.

An oscillating heat pipe (OHP or pulsating heat pipe) is a thermally pumped, two phase device that is formed by one or more meandering, hermetically sealed channel that crosses heating and cooling zones multiple times. The channel(s) is/are filled with a saturated two-phase mixture that, due to the channel diameter and fluid properties, forms a train of liquid plugs and vapor bubbles. When heat is applied, and more particularly absorbed by the fluid in the heat pipe(s), the resulting evaporation and condensation processes create pressure imbalances that, coupled with the random distribution of liquid plugs and vapor bubbles, generates motion of the two-phase mixture.

More specifically, an oscillating heat pipe (OHP or pulsating heat pipe) is a passive heat transfer device that transports heat using two-phase fluid flow within capillary-sized tubes or tunnels (i.e., tubes or tunnels sized such that they have a capillary effect on a working fluid disposed therein) which have a meandering, tortuous path traveling between areas of the device in thermal contact with one or more heat sources and one or more heat sinks or cooling zones. The volume of the tunnel pattern is partly filled with a working fluid and hermetically sealed from the outside environment. The tunnel's hydraulic diameter must be small enough and the surface tension of the working fluid great enough such that the fluid disperses itself throughout the tunnel interior area in discrete liquid "plugs" and vapor "bubbles" (i.e. capillary action).

In operation, the OHPs transfer heat from the heat source area(s) to the heat sink(s) or cooling zone(s) as follows: the working fluid (also called cooling fluid) partially evaporates and expands in the tunnel areas at or near the heat source area(s); the associated expansion working fluid vapor forces or drives the working fluid vapor axially in tunnels from the heat source area(s) toward the lower temperature, lower pressure heat sink area(s) or cooling zone(s) where incoming fluid vapor rejects its heat, condenses back to a fluid, and contracts; as a result the working fluid initially near the heat sink area(s) or cooling zone(s) is dislodged by the incoming fluid and is directed through the tunnel's tortuous path toward heat source area(s); and the cycle repeats as the working fluid and working fluid vapor oscillates between the tunnel areas in thermal contact with the heat source(s) and the area in thermal contact with the heat sink(s) or cooling zone(s).

OHPs utilize both the phase change heat transfer (i.e. evaporation and condensation) and convection heat transfer (i.e. oscillating fluid mass flows with changing temperatures) of the working fluid, and have been proven capable of very high heat transport capacities across a broad range of heat loads and operating conditions. Furthermore, OHPs can be made from a wide range of material and fluid combinations and in a variety of shapes and sizes in order to meet the specifications of a given application's heat source(s) and heat sink(s) or cooling zone(s) (e.g. their sizes, heat loads, heat fluxes, locations, temperatures, gravitational fields, coefficients of thermal expansion requirements, etc.).

The OHP's tunnel patterns can form a closed-loop (e.g. circulating), or they can be sealed at each end to form an open-loop (e.g. serpentine or linear). Furthermore, OHP's tunnel patterns can travel in two dimensions (i.e. in x-y plane if in a body-like pattern, or in a disk-like pattern in the r-θ plane) or in all three physical dimensions (i.e. x-y-z and/or r-θ-h). Tunnel cross-sections can be effective in many shapes (e.g., circular, semi-circle, rectangle, square, etc.) and tunnel lengths can vary (e.g., from less than 50 cm to greater than 1 m) so long as they maintain the capillary effect where the working fluid inside the tunnel volume is dispersed in discrete liquid "plugs" and vapor "bubbles". Generally, the closer packed the tunnels are (and the greater the number of turns in the meandering tunnel pattern) the better the thermal performance.

OHPs (closed-loop and open-loop), when charged with working fluids, have proven effective at transferring heat within the tunnels when the internal tunnel volume is filled from 10% to 90% with working fluid. Working fluids can be selected based on their thermophysical properties (e.g. vapor pressures, latent heats, specific heats, densities, surface tensions, critical temperatures, pour points, viscosities, etc.). An OHP designer often will select the working fluid(s) for a given application's specifications, then design the OHP's tunnel size(s) and flow path(s) to be compatible with selected working fluid(s). Selected fluids must, however, be compatible with the material(s) used to form the tunnel path(s) and instabilities or reactions from electro-chemical mismatches between fluids and materials are to be avoided. Material selection criteria include, but are not limited to, thermal conductivity, density, temperature stability, strength, hardness, ductility, manufacturability (i.e. ease of shaping, cutting, bending, and attaching to itself or other materials), coefficient of thermal expansion, cost, availability, porosity, etc. For the purposed of this disclosure, the semiconductor properties are critical.

Regarding the external shape, size, and contours of an OHP-based heat transfer device (i.e., the form factors), it is advantageous that the shape of the heat transfer device have a surface that attaches intimately to the heat source(s) and to the heat sink(s) or cooling zone(s), and the most common surfaces. The internal OHP tunnel patterns can be formed using a variety of manufacturing methods including, but not limited to: winding tubing into a serpentine or circulatory pattern (and such tubing can then be attached to separate flat body(s) material with grooves into which the tubing can be partially or fully enclosed); forming grooves on or through a flat body(s) and then sealing those grooves with a lid(s) or cover body(s); and utilizing additive manufacturing techniques to inherently form tunnels within a solid body (e.g. 3D-printing, direct metal laser sintering/melting, stereo lithography, ultrasonic additive manufacturing, electron beam freeform fabrication, etc.). As described more fully below, in various embodiments, the internal OHP tunnels (referred to below as channels) can be formed integrally with the fabrication of the IC device.

Figure 1A:
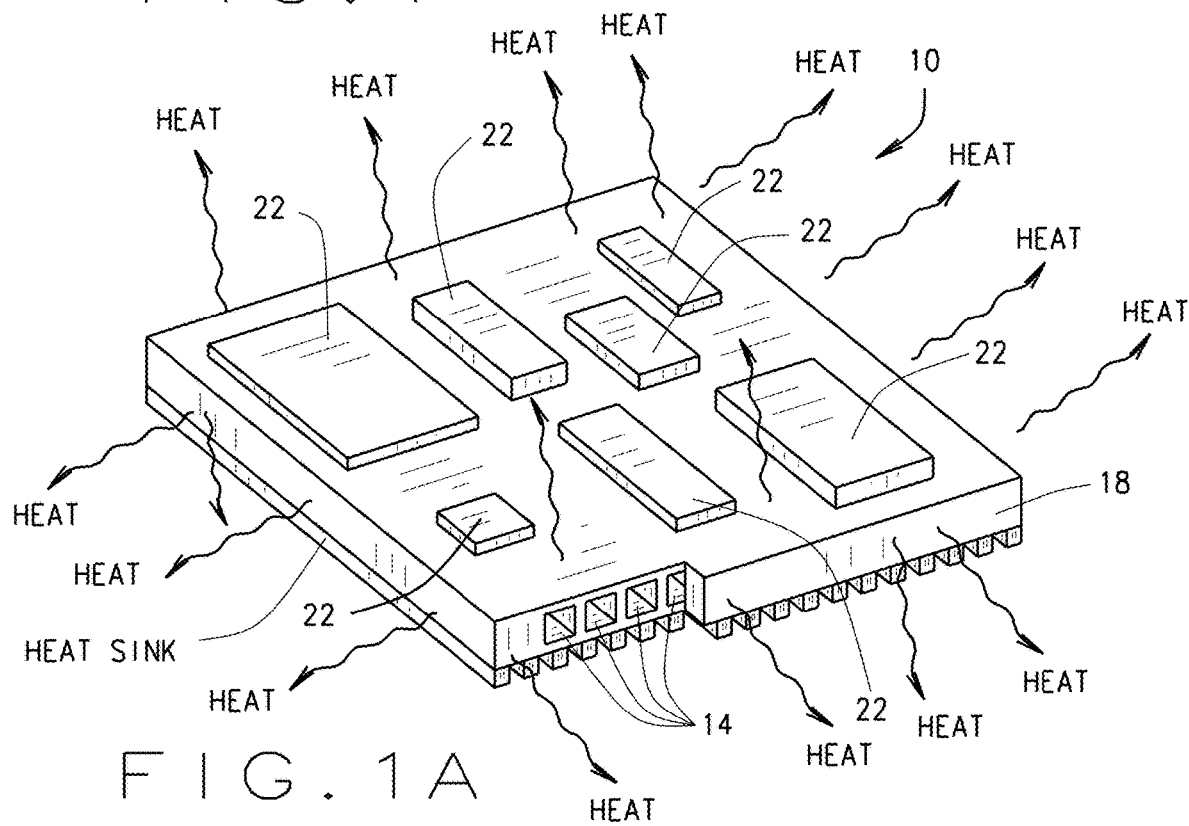
FIG. 1A is an isometric view of the integrated circuit device shown in FIG. 1 mounted to and heat sink, in accordance with various embodiments of the present disclosure.
Figure 3:
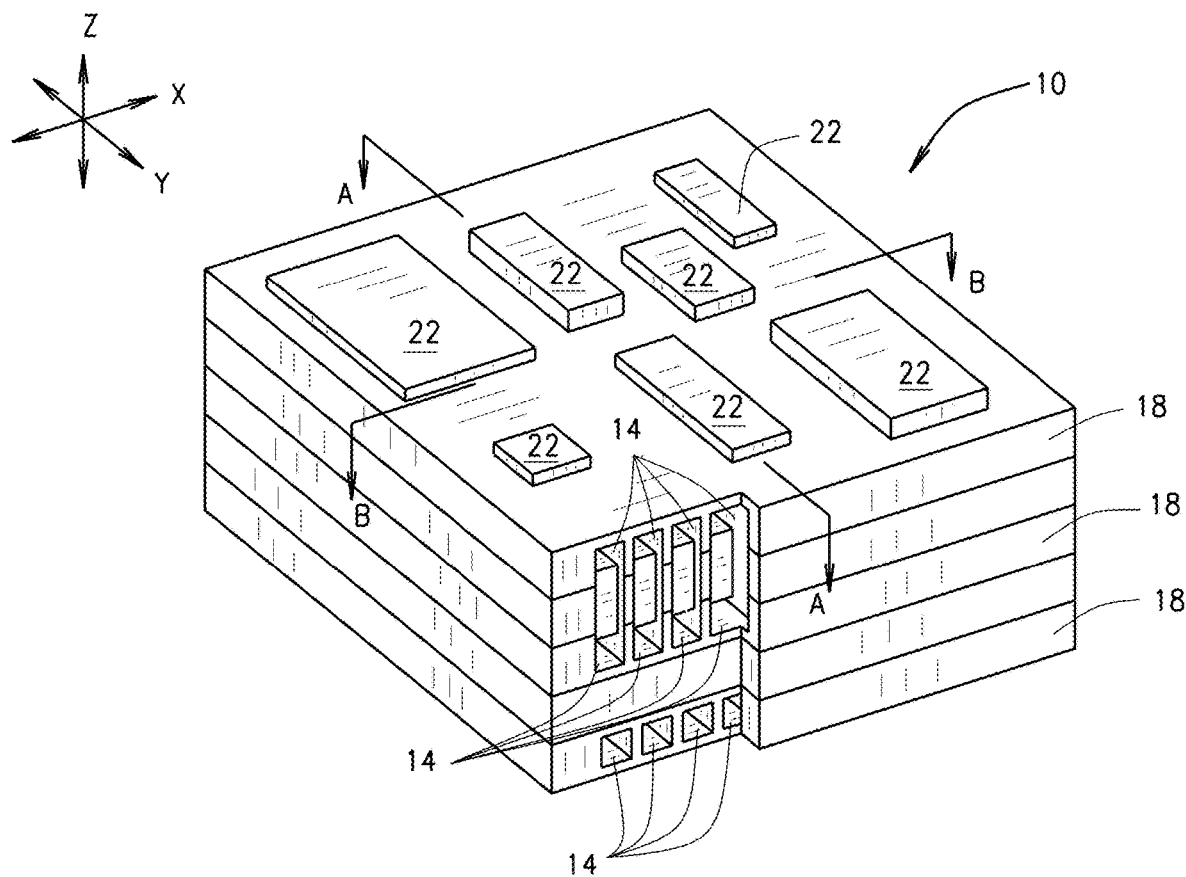
FIG. 3 is an isometric view of an exemplary 3-dimensional, or stacked, integrated circuit device having a portion removed to show miniaturized oscillating heat pipes (OHPs) provided, or formed, in 3-dimensions therein, in accordance with various embodiments of the present disclosure.
Figure 4:
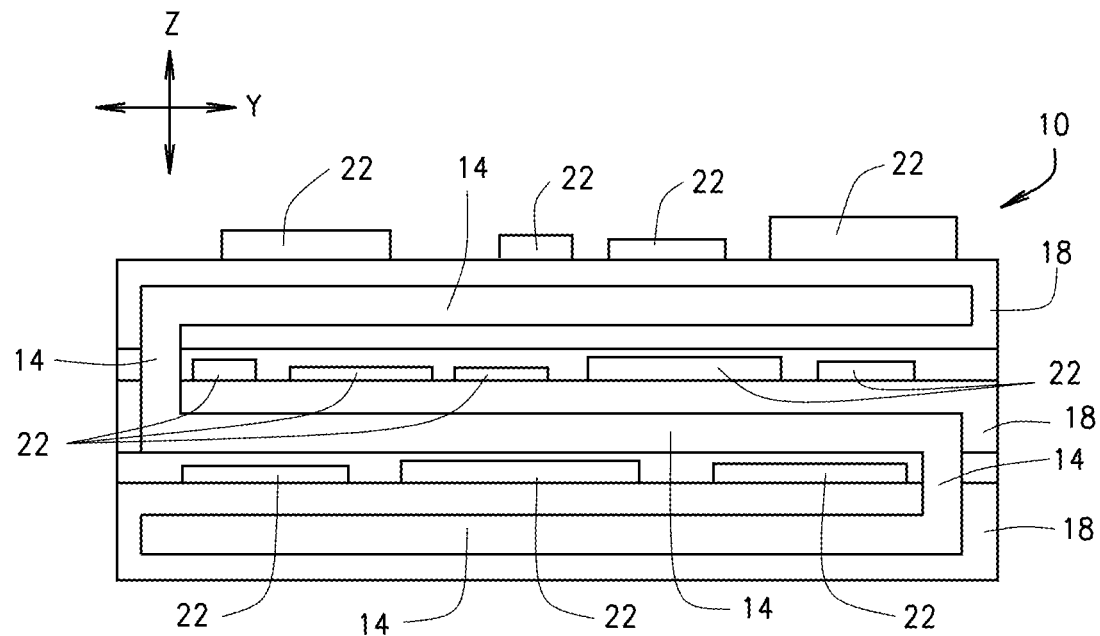
FIG. 4 is a cross-sectional view of the integrated circuit device shown in FIG. 3 along line A-A, in accordance with various embodiments of the present disclosure.
Figure 5:
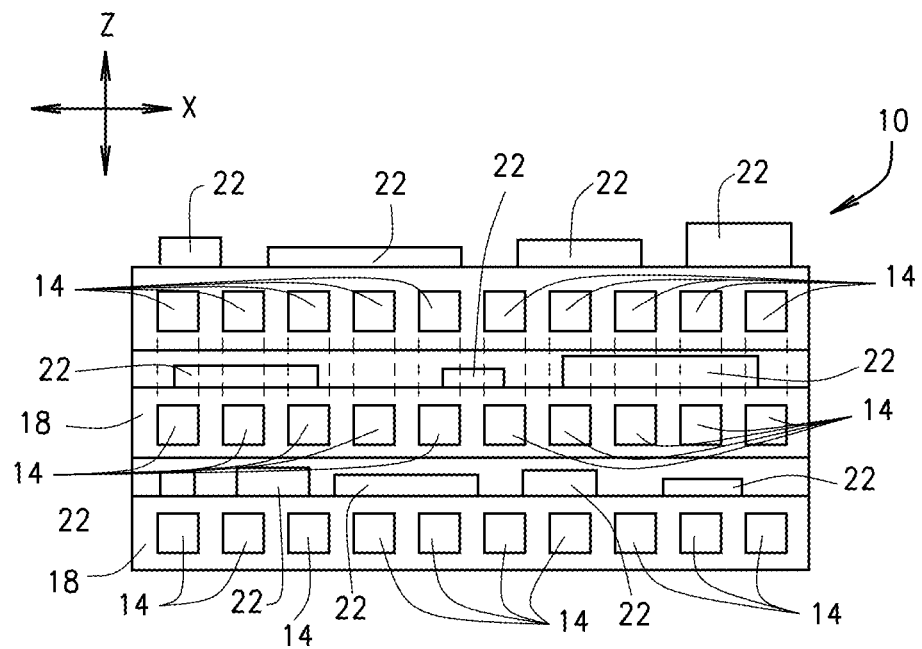
FIG. 5 is a cross-sectional view of the integrated circuit device shown in FIG. 3 along line B-B, in accordance with various embodiments of the present disclosure.

Referring now to FIGS. 1, 1A and 2, the present disclosure provides a monolithic integrated circuit (IC) device, or chip, 10 having an internal cooling system structured and operable to cool the IC device 10, more particularly to transfer local heat from the IC semiconductor device(s) 22 (described below). More particularly, the IC device 10 comprises one or more oscillating heat pipe (OHP) 14 integrally formed internally within a substrate 18 fabricated of a semiconductor material, e.g., silicon. More specifically, the IC device 10 comprises the substrate 18 having the OHP(s) 14 integrally formed therewith, and provided internally therein, and one or more semiconductor devices 22 (often referred to as active elements) provided, formed, or fabricated on the substrate 18. The semiconductor device(s) 22 form one or more electronic or optical circuit that provide the functionality of the IC device 10.

In various embodiments, each OHP 14 comprises one or more meandering multi-pass oscillating heat pipe channel (e.g., micro-channel) integrally formed internally within the respective substrate 18. Each OHP 14 channel(s) can be integrally formed therein using any desirable process. For example, in various instances, each OHP 14 channel(s) can be cut or etched into a base sheet of the respective substrate 18, and then hermetically sealed with a top sheet after a saturation fluid is disposed within the OHP 14 channel(s). Alternatively, in various instances the IC device 10 and/or the substrate 18 having the internal OHP 14 channel(s) integrally formed internally therein can be fabricated using and additive process (e.g., 3D printing) that include disposing the saturation fluid within the OHP 14 channel(s) prior to completion of the process. In various other instances the IC device 10 and/or the substrate 18 having the internal OHP 14 channel(s) integrally formed internally therein can be fabricated using bulk micromachining, surface micromachining, deep reactive ion etching, LIGA (lithography, electroplating, and molding), hot embossing, micro-EDM (electrical discharge machining), XeF2 Dry Phase Etching, focused ion beam micromachining, CVD (chemical vapor deposition), and/or PVD (physical vapor deposition).

In various embodiments, each OHP 14 channel is a meandering multi-pass capillary channel that is filled with a saturation or working fluid (referred to herein as the OHP fluid). Since the OHP 14 channel(s) are integrally formed within the substrate 18 on which the semiconductor device(s) 22 are formed, the OHP 14 channel(s) pass near and/or adjacent and in close proximity (e.g., within approximately tens to hundreds of microns) to the semiconductor devices 22 formed on the substrate 18. The capillary dimensions of the OHP 14 channel(s) (e.g., from hundreds of nanometers to hundreds of microns) force the OHP fluid into a train of liquid plugs and vapor bubbles. As heat is absorbed from the heat generating semiconductor device(s) 22 by the OHP fluid within the OHP 14 channel(s), evaporation and condensation of the OHP fluid occurs that cause a pressure imbalance from the evaporator region(s) of the OHP 14 channel(s) to condenser region(s) of the OHP 14 channel(s). The evaporator region(s) of the OHP 14 channel(s) are the regions of OHP 14 channel(s) that pass within the substrate 18 near and/or adjacent and close proximity to one or more of the heat generating semiconductor devices(s) 22. The evaporator regions are sometimes referred to herein as hot spots of the IC device 10. The condenser regions of the OHP 14 channel(s) are the regions of the OHP 14 channel(s) that pass within the substrate 18 near and/or adjacent a region of the substrate 18 not occupied by a heat generating semiconductor device(s) 22. For example, regions of the OHP 14 channel(s) that pass within the substrate 18 near and/or adjacent a region of a top surface, bottom surface, or other surface of the substrate 18 that is not occupied by a heat generating semiconductor device(s) 22 and exposed to ambient air, or is in thermal contact with any suitable heat sink device 26 (as exemplarily shown in FIG. 1A).

This pressure imbalance forces the OHP fluid to move within the OHP 14 channel(s), transferring heat (e.g., both latent and sensible heat) from the evaporation portion(s) of the OHP 14 channel(s) (e.g., from hot spots of the IC device 10) to the condenser portion(s) of the OHP 14 channel(s), thereby removing heat from, and cooling, the respective semiconductor devices 22, and the IC device 10 overall. More specifically, when heat is absorbed at the evaporator region(s) of the OHP 14 channel(s), bubbles are formed by partial vaporization of the OHP fluid within the channel in the evaporator region. The bubble's expansion is limited radially by the fixed diameter of the OHP 14 channel(s) and thus, the bubble expands axially (i.e., along the length of the OHP channel). The axial-wise expansion dislodges neighboring plugs/bubbles in a first portion of the OHP 14 channel(s) and forced them away from the evaporation region(s). The dislodged vapor phase OHP fluid moves through the OHP 14 channel(s) to the condenser region(s) where the heat of the vapor phase OHP fluid is rejected into the ambient air (or suitable heat sink, e.g., heat sink 26) such that the vapor phase OHP fluid converts back to liquid phase. Hence, heat is removed from the semiconductor device(s) 22 at the evaporator region(s) (e.g., the hot spots of the IC device 10) and transferred to the condensation region(s), thereby removing the heat from, and cooling, the respective semiconductor device(s) 22, and the IC device 10 overall. While in the condenser region(s) of the OHP 14 channel(s), the vapor phase OHP fluid is cooled and converts back to the liquid phase plug, which then moves back to the evaporator region(s) of the OHP 14 channel(s) to repeat the vaporization-condensation cycle to continuously remove heat from, and cool, the respective semiconductor device(s) 22, and the IC device 10 overall. In various instances wherein the OHP 14 channel(s) pattern includes 180-degree turns, some of the plugs/bubbles move through the turns and are directed back toward the evaporator region in a second portion of the OHP 14 channel(s) adjacent to the first portion.

Importantly, the OHP 14 channel(s) is/are integrally formed within the substrate 18 such that it/they has/have substantially direct access to the hot spots of the IC device 10. That is, the OHP 14 channel(s) pass near and/or adjacent and in close proximity to the semiconductor device(s) 22 (e.g., within approximately tens to hundreds of microns). Once the substrate 18 is fabricated in accordance with the principles of the present disclosure, the substrate 18 will appear as a typical substrate wafer from which to begin processing the semiconductor device(s) 22. Although the OHP 14 channel(s) is/are exemplarily illustrated in the various figures as having a generally square cross-section, it is envisioned that in various other embodiments the OHP 14 channel(s) can have generally any cross-sectional shape. For example, in various embodiments, the OHP 14 channels can have a round, rectangular, triangular, oval, etc. cross-sectional shape and remain within the scope of the present disclosure.

Referring now to FIGS. 1, 2, 3, 4 and 5, additionally, it is envisioned that the OHP 14 channel(s) can follow any desired internal, integrally formed, topology or path within the IC device 10 (e.g., a two-dimensional and/or a three-dimensional topology or path within the IC device 10). For example, in various embodiments, as exemplarily illustrated in FIGS. 3, 4 and 5, the IC device 10 can be a multi-level IC device 10 having a plurality of stacked substrates 18, wherein each substrate includes the OHP 14 channel(s) integrally formed therein (as described above), and furthermore wherein the multi-level IC device 10 is fabricated such that OHP 14 channel(s) is/are integrally formed within the IC device 10 in a three-dimensional (3D) array such that the integrally formed OHP 14 channel(s) meander through the IC device 10, in close proximity to the semiconductor devices 22, in the X, Y, and Z directions. Each substrate 18 has semiconductor devices 22 formed thereon such that some semiconductor devices 22 are formed internally within the IC device 10.

In various embodiments, thru-holes in the substrates 18 can be aligned with the OHP 14 channel(s) integrally formed internally within the substrate layers 18 to provide the Z-axis portion(s) of the 3D OHP 14 channel(s) integrally formed within the IC device 10. This will ensure the OHP fluid within the OHP 14 channel(s) can circulate between substrates, thereby effectively transferring heat from deep within the IC device 10 out to the ambient air, or any suitable heat sink (e.g., heat sink 26), as described above. Because the OHP 14 channel(s) only need to be hermetically sealed, the OHP 14 channel(s) can be integrally formed anywhere within the multi-level IC device 10 that does not interfere with the IC operation. Additionally, the substrates 18 can be fabricated of any suitable substrate material. In such 3D embodiments of the IC device 10, the hot spots of the IC device 10, and hence the evaporator regions of the 3D OHP 14 channel(s) will be near and/or adjacent and in close proximity to both the internally formed semiconductor device(s) 22 and the externally formed semiconductor device(s) 22 (e.g., within tens to hundreds of microns of the internal and external semiconductor devices 22). Moreover, the OHP fluid will move though the 3D OHP 14 channel(s) such that heat is extracted by the OHP fluid from both the internal and external hot spots (i.e., from both the internal and external semiconductor devices 22), and transferred to the condenser regions of the OHP 14 channel(s). In such embodiments, the condenser regions of the 3D OHP 14 channel(s) are the regions of the 3D OHP 14 channel(s) that pass within the substrates 18 (in the X, Y and/or Z direction) that are near and/or adjacent any region of the substrates 18 not occupied by a heat generating semiconductor device(s) 22. For example, regions of the 3D OHP 14 channel(s) that pass within the substrates 18 near and/or adjacent a region of a top surface, bottom surface, side surface or other surface of the substrates 18 that is not occupied by a heat generating semiconductor device(s) 22 and exposed to ambient air, or is in thermal contact with any suitable heat sink device (e.g., heat sink 26).

Although the OHP 14 channel(s) has/have been illustrated in the various figures in various exemplary 2D and 3D meandering pathways arrangements, arrays, and topologies, the possible 2D and 3D meandering pathways arrangements, arrays, and topologies of the 2D and 3D IC devices 10 disclosed herein is not limited to those exemplarily illustrated. For example, although the Z-axis portions of the OHP 14 channel(s) are exemplarily illustrated to be integrally formed at or near the sides of the respective IC device 10, in various embodiments, it is possible for the 3D OHP 14 channels to include Z-axis portions that are integrally formed more interiorly within the 3D IC device 10 (e.g., further away from the sides, toward and/or at the middle of the 3D IC device 10), and remain within the scope of the present disclosure. Additionally, in various embodiments, it is possible for the 3D IC device 10 to comprise OHP 14 channel(s) that include Z-axis portions integrally formed within the 3D IC device 10 both near the sides of the 3D IC device 10 and more interiorly within the 3D IC device 10, and remain within the scope of the present disclosure.

Furthermore, as illustrated throughout the figures, in various embodiments, the OHP 14 channels meander through approximately an entirety of an internal plane of the respective substrate 18 that is defined by the perimeter of the respective substrate 18 (i.e., the channels meander internally through the respective substrate 18 approximately from one side to the other and from one end to the other). However, it is envisioned that in various embodiments, the OHP 14 channels can meander through less than approximately the entirety of an internal plane of the respective substrate 18 that is defined by the perimeter of the respective substrate 18, depending on the structure of the IC device 10, and/or the layout and location of the respective semiconductor devices 22, and the desired cooling efficiency of the OHP 14.

Additionally, it is envisioned that, depending on the structure of the IC device 10, and/or the layout and location of the respective semiconductor devices 22, and the desired cooling efficiency of the OHP 14, each substrate 18 can have more than one layer of OHP 14 channels integrally formed therein and remain within the scope of the present disclosure. In such instances, such substrates 18 can include OHP 14 channels integrally formed within the respective substrate 18 in the X, Y and Z axis directions. Hence, a single substrate IC device 10 can have a plurality of levels of OHP 14 channels, wherein the channels run in the X, Y and Z axis directions within the respective substrate 18. Or, in a multi-level IC device 10 one or more of the substrates 18 can have a plurality of levels of OHP 14 channels, wherein the channels are integrally formed in the X, Y and Z axis directions within the respective substrate 18, and wherein the OHP 14 channels for all of the substrates 18 are interconnected via sections of the various OHP 14 channels integrally formed in the Z axis direction.

Figure 6:
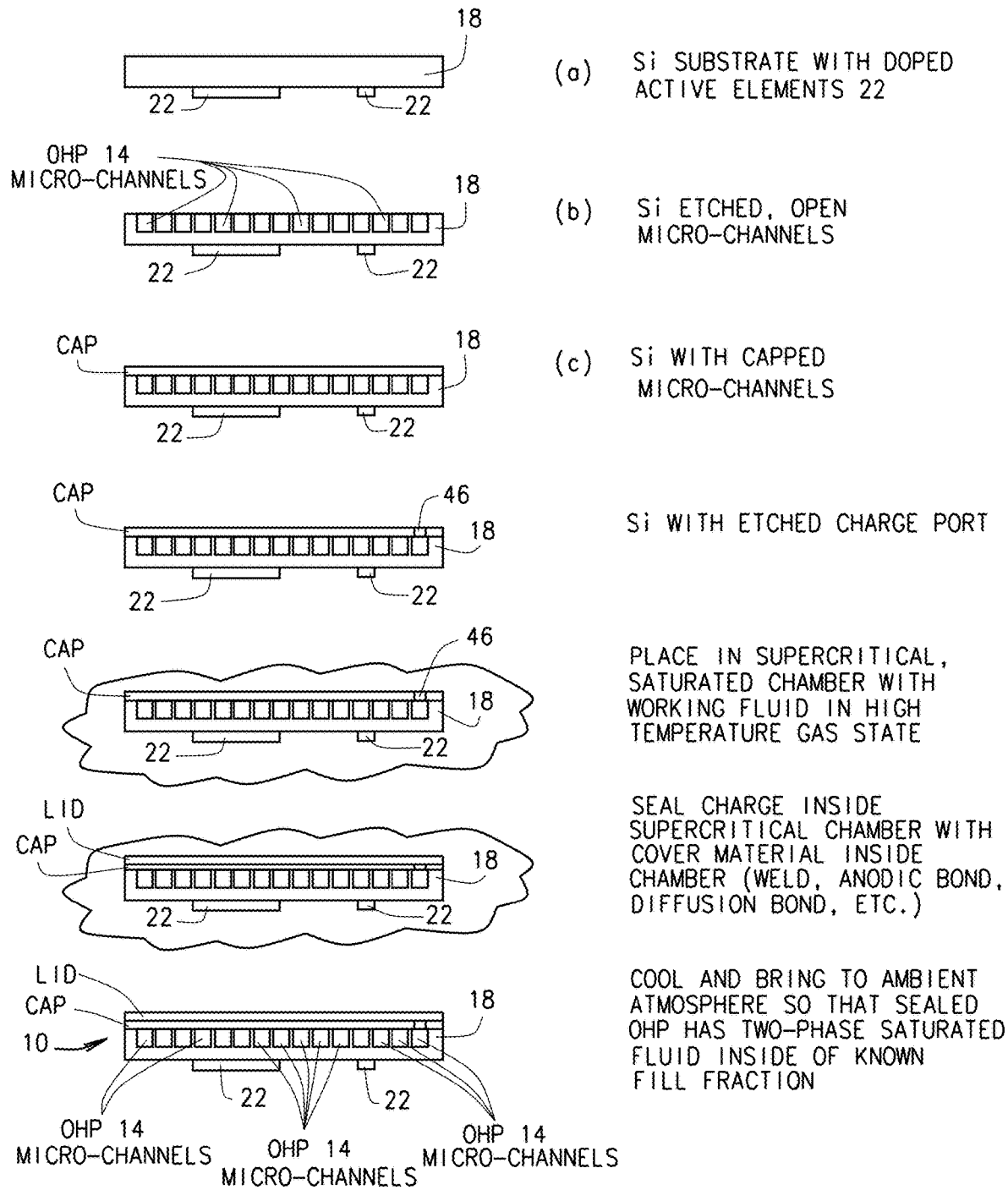
FIG. 6 is an illustration of an exemplary method for charging, i.e., filling, channels of the OHP that are integrally formed within the substrate with an OHP working fluid, in accordance with various embodiments of the present disclosure.

Referring now to FIG. 6, in various embodiments, the OHP 14 channels integrally formed within the substrate(s) 18 can be on the order of hundreds of nanometers to hundreds of microns (or smaller) wide and/or tall or in diameter. As described above, fabrication of OHP 14 channels (e.g., 100 μm micro-channels) into a monolithic substrate 18 can be achieved in various methods.

For example, methods used for pumped coolant (active) cooling of three-dimensional microchips can be used. For example, there are a variety of methods available for forming micro-channels within a three-dimensional circuit, including plasma etching prior to wafer bonding, sacrificial silicon channels, and even chemical etching. Additionally, vertical etching methods used to form vertical channels through wafers for electrical connections, can be leveraged to provide the Z-axis portion of the OHP 15 channels. Alternatively, micro-channels can be integrally formed in silicon substrates of complimentary metal-oxide semiconductor (CMOS) using a single-step DRIE process (Deep Reactive Ion Etching), whereby a network of micro-channels with a High Aspect Ratio (HAR) up to 10, can be etched in a silicon substrate through a mesh mask. In the same single etching step, multidimensional micro-channels with various dimensions (width, length, and depth) can be obtained by tuning the process and design parameters. These fully formed structures enable further wafer processing and integration of electronic components like sensors and actuators in wafers with micro-channels.

Once the OHP channels are formed in one face of the substrate (e.g., silicon wafer) bonding techniques can be used to cap or seal the open faces of the channels, and if necessary, build multiple layers of new IC devices on successive substrate layers. In various embodiments, methods for capping the open channels can include metal-eutectic bonding or recrystallization of polysilicon (i.e., deposit polysilicon and induces recrystallization of the polysilicon film using intense laser or electron beams). For example, wafer stacking or bonding methods including "polyimide adhesive layers, Cu—Cu thermocompression method and/or microbumps with liquid epoxy injection. The wafer bonding process preserves electrical characteristics of each device layer and can be repeated without damaging existing circuits. Lastly, metallization of the IC device external surfaces (e.g., thin 50 Angstrom Ti or Au adhesion layer) can be added to easily bond the IC device to the ultimate chip package's electrical, mechanical and thermal elements. Multi-IC device wafers can then be diced using industry standard processes.

In addition to integrally forming micro-channels inside a monolithic IC substrate, the micro-channels must be fluidly charged such that the fluid amount is precisely known, chemically pure, and hermetically sealed so that such fluid does not leak out of channels post-fabrication. These are critical features for a reliably operated OHP heat transfer device.

In various embodiments, to charge and seal the OHP 14 channels, the present disclosure exemplarily provides a charging and sealing method having the following steps: a) start with traditional IC device having one or more semiconductor device 22 (e.g., one or more transistor or other element) formed on the substrate 18; b) etch the micro-channels into the substrate 18 per any desired method, such as those described above; c) cap or seal the micro-channels per and desired method, such as those described above, (e.g., and additive process such as 3D printing); d) etch charge port 46 into one face of the substrate cap; e) saturate the environment or fabrication chamber of the partially fabricated IC device 10, having the OHP 14 channels accessible via the charge port 46, with a supercritical OHP fluid in a high temperature gaseous state and precise temperature control, whereby the OHP 14 channels are filled with the gaseous state OHP fluid; f) seal the charge port 46 using any suitable device and/or method, for example dispose a lid or plug onto or into the charge port 46 and seal the lid or plug over or within the charge port 46 using any suitable boding/sealing method, e.g., welding or other bonding/sealing method; g) cool the completed IC device 10 and remove it from chamber such that internal OHP fluid mass and channel volume are known, and determine fill fraction therein (e.g., supercritically charged OHP).

Referring now to FIGS. 1, 1A, 2, 3, 4, 5, 6 and 7, as described above, the present disclosure provides the IC device 10 having one or more oscillating OHP 14 integrally formed or disposed within the one or more substrate 18. As also described above, the IC device 10 comprises the substrate 18 having the OHP(s) 14 integrally formed therein and one or more semiconductor devices 22 provided, or formed, on the same substrate 18. Importantly, the semiconductor device(s) 22 and OHP(s) 14 are both respectively formed on and integrally formed within the same substrate material 18. Therefore, the IC device 10, in all of the various embodiments described above, is a monolithic IC device with the internal OHP 14 channels integrally formed therein In implementation and operation, the IC device 10 can be assembled into a larger package to: (1) electrically connect to power source(s); and (2), thermally connect to one or more heat sink (e.g., heat sink 26), wherein the heat sink(s) attach to one or more of the external surfaces of the substrate(s) 18.

Generally, when powered on, the semiconductor device(s) 22 generate heat that flows through substrate(s) 18 and is at least partially rejected to a heat sink (e.g., heat sink 26). If the heat is not adequately transferred from devices 22 to heat sink 26, the IC device 10 temperature will rise. And, if temperature of the IC device 10 rises to an upper limit of the respective semiconductor device 10, which will vary based on the respective semiconductor material and application, (e.g., less than 200 degrees Celsius for standard Silicon IC devices though such upper temperature limit varies by different semiconductor material (Si, SiC, GaN, GaAs, etc.), type of device (e.g., diode, bipolar transistor, field-effect transistor, etc.), circuit type (analog or digital), application requirements (e.g. service life, acceptable output variation, etc.), and other factors), then the IC device 22 can either degrade or fail to operate. The heat generated by the semiconductor device(s) 22 is transferred from semiconductor device(s) 22 into substrate 18 at the interface area between the semiconductor device(s) 22 and the substrate(s) 18. The amount of heat at the device-to-substrate interface is referred to as the device-level high heat flux. The total heat generated by the IC device 10 is the sum of the heat generated by all the respective semiconductor devices 22. The total amount of heat at the chip-to-heat sink interface is referred to as the chip-level heat flux.

From a thermal standpoint, the substrate(s) 18 act(s) as both a heat conductor and a heat spreader. Particularly, as a heat conductor, the substrate(s) 18 function to minimize the heat rise across the distance between the device-level interface(s) and the heat sink- interface(s). Generally, temperature rises through a solid body (e.g., the substrate(s) 18) are positively correlated with the thermal conductivity of the solid body and the heat transfer length through the solid body. As a heat spreader, the substrate(s) 18 function to maximize the useful heat rejection area at the heat sink interface(s). Temperature rises across interfaces are positively correlated with their heat fluxes (i.e., the higher the heat flux the higher the temperature rise across an interface) or for given heat load it is desirable (i.e., lower temperature rise) to dissipate across a larger area.

For these reasons, the OHP(s) 14 is/are integrally formed inside the substrate(s) 18 to acquire and transfer heat from the high heat flux device interfaces and spread it across the larger heat sink interfaces with minimal temperature difference between these locations. Two-phase oscillating heat pipes, such as the OHP(s) 14 (or often referred to as pulsating heat pipes) have proven to have the ability to transfer heat at much higher effective thermal conductivities than solid materials, and to have the ability to transform very high input heat fluxes to much lower heat rejection fluxes.

Figure 7:
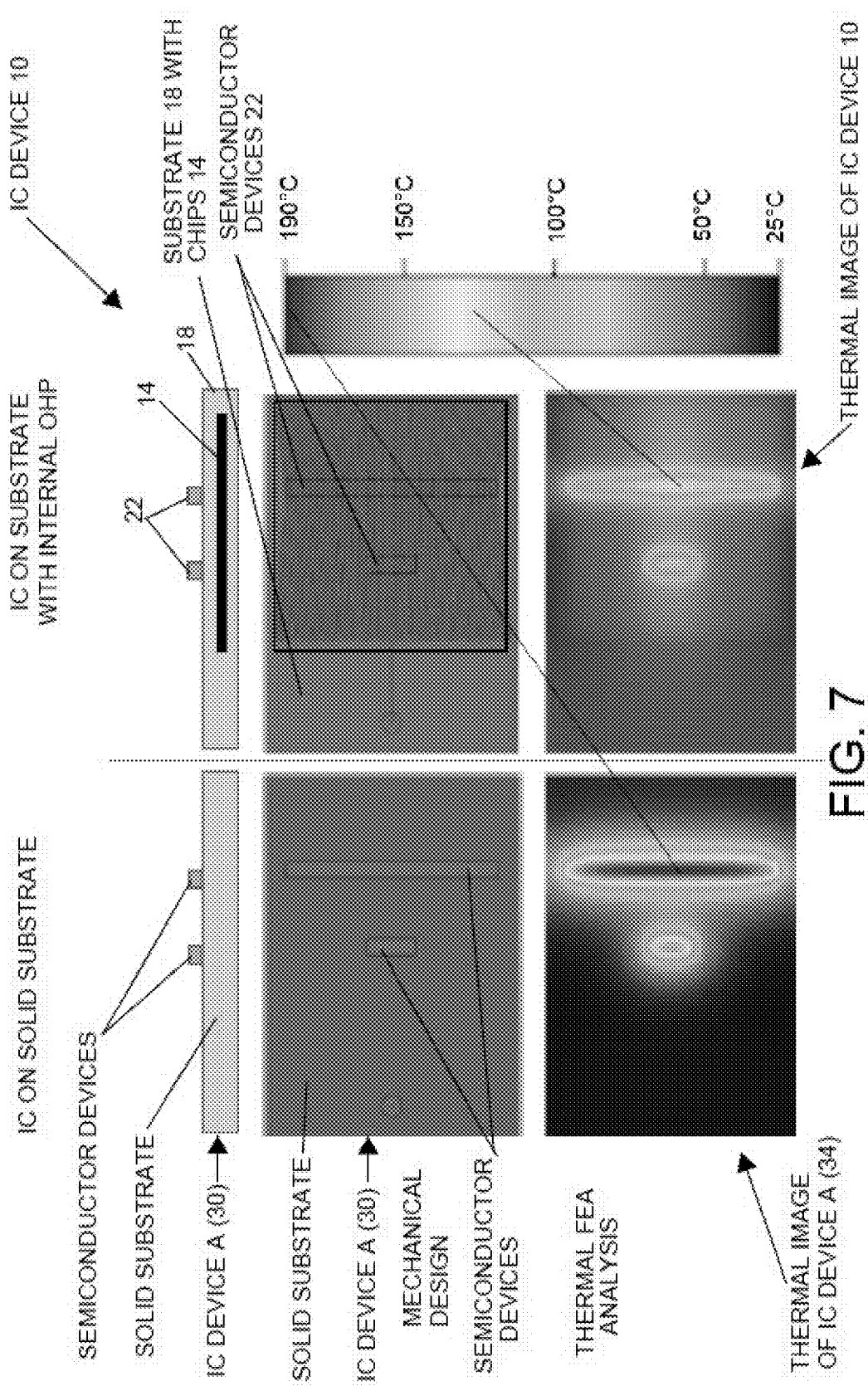
FIG. 7 is a color thermal energy diagram illustrating the cooling efficiency of the miniaturized oscillating heat pipes (OHPs) integrally formed within the integrated circuit device shown in FIGS. 1, 1A, 2, 3, 4 and 5, in accordance with various embodiments of the present disclosure.

For example, FIG. 7 illustrates an IC device (such as IC device 10) with two discrete, high heat flux semiconductor devices (such as semiconductor devices 22) on a substrate with a heat sink (not shown) on the opposite face of the substrate from the semiconductor devices. The leftmost (relative to the orientations shown in FIG. 7) IC device A (identified by reference number 30) comprises a solid substrate having no internal OHPs, and the rightmost (relative to the orientations shown in FIG. 7) IC device is an IC device 10, as described above, comprising the substrate(s) 18 having the integrally formed internal OHP(s) 14. Both IC device A (30) and IC device 10 were operated, whereby the semiconductor devices of each generated heat. Thermal images were taken of both the IC device A (30) and 10, which are illustrated and identified in FIGS. 7 as (34) and (42), respectively. The thermal images (34) and 42) clearly illustrated that the IC device 10, comprising the integrally formed OHP(s) 14 more effectively and comprehensively spreads or dissipates heat from the semiconductor devices 22 to the larger substrate-to-heat sink interface area and in doing so dramatically lowers the operating temperature of the IC device 10 (relative to the IC device A) and/or enables higher heat flux operation of the semiconductor devices 22 without exceeding the upper operating temperature limits of the respective semiconductor devices 22.

Integrated circuits are used across many facets of modern life, for example, a non-limiting list of applications includes processors, power amplifiers, laser diodes, and LEDs. The use of the integrally formed OHP 14 channel(s) (e.g., OHP 14 micro-channels), allows for heat to be drawn from the localized hot spots within the 2D and 3D IC devices 10 and transported to the condenser regions of the OHP 14 channel(s) where the heat is rejected from the OHP fluid to the ambient environment or a suitable heat sink (as described above). Moreover, by fabricating the substrate(s) 18 such that the OHP 14 channels are integrally formed within the respective substrate 18, the formation or deposition of the semiconductor device(s) 22, and other downstream assembly processes are unaffected.

The OHP 14 described herein does not require external energy input, other than the heat source itself. The OHP 14 described herein operates because it forms liquid plugs and vapor bubbles within the OHP 14 channel (e.g., micro-channels), making the small channel size a benefit, rather than a detriment. By incorporating existing IC fabrication techniques to integrally form the OHP 14 channel(s) within the substrate(s) 18, the substrate(s) 18 can be easily integrated into the IC production process, eliminating thermal interface resistances, fluid connections, excess electrical connections, and allowing seamless integration in the downstream packaging of the monolithic IC device 10 into a complete system. The effectiveness of the heat transfer along with the closed-form (e.g., closed loop) OHP 14 channel(s) allows the OHP 14 to be integrally formed within an IC device 10 and delivered as a IC device with an integrally formed thermal management solution.

As described above, the monolithic IC device 10 of the present disclosure is a monolithic, passive fluid cooling of two-dimensional or three-dimensional IC device where the semiconductor device(s) 22 (e.g., active element(s)) and the OHP 14 channel(s) is/are integrally formed into the same material (i.e., into the same substrate 18) and can be constructed in either a single-layer (two-dimensional) or multi-layer (three-dimensional) form factor so that the locally-generated heat from the semiconductor element(s) 22 is fluidly transferred to the larger IC device surfaces (e.g., the surfaces of the substrate(s) 18 that are not occupied by a semiconductor device 22) for ultimate heat rejection. The present disclosure additionally provides a novel procedure for forming, or building, and filling the micro-channels with a precise amount of working fluid and sealing such working fluid inside the OHP 14 channels. This is important because the method disclosed herein will enable high-volume low cost and reliable manufacture of monolithic IC devices with integrally formed internal OHPs 14 to cool both state of the art two-dimensional IC devices, but also next-generation three-dimensional IC devices that have even more challenging intra-chip heat transfer issues that this systems and methods of the present disclosure overcome.

The description herein is merely exemplary in nature and, thus, variations that do not depart from the gist of that which is described are intended to be within the scope of the teachings. Moreover, although the foregoing descriptions and the associated drawings describe example embodiments in the context of certain example combinations of elements and/or functions, it should be appreciated that different combinations of elements and/or functions can be provided by alternative embodiments without departing from the scope of the disclosure. Such variations and alternative combinations of elements and/or functions are not to be regarded as a departure from the spirit and scope of the teachings.

What is claimed is:

1. An integrated circuit device, said device comprising:
   a single body monolithic non-porous substrate,
   at least one semiconductor device integrally formed with and having electrical continuity within the single body monolithic non-porous substrate, and
   at least one internal oscillating heat pipe integrally and wholly formed and enclosed within, in its entirety, the single body monolithic non-porous substrate, the at least one internal oscillating heat pipe comprising at least one meandering multi-pass channel laterally extending throughout the entire single body monolithic non-porous substrate and having a closed loop design, the at least one internal oscillating heat pipe structured and operable to spread heat generated by the at least one semiconductor device, via motion of a working fluid within the at least one multi-pass channel, the motion generated by the heat from the at least one semiconductor device, away from the at least one semiconductor device, across one or more surface of the single body monolithic non-porous substrate, to minimize a maximum temperature of the entire integrated circuit device.

2. The integrated circuit device of claim 1, wherein the single body monolithic non-porous substrate is fabricated of at least one of Silicon, Silicon Carbide, Alumina, Aluminum Nitride, GaN, or GaAs.

3. The integrated circuit device of claim 1, wherein the at least one internal oscillating heat pipe is integrally and wholly formed within the single body monolithic non-porous substrate such that the heat generated by the at least one semiconductor device is spread to at least one specific area of the single body monolithic non-porous substrate for heat rejection to a heat sink to which the integrated circuit device can be placed in thermally conductive contact.

4. The integrated circuit device of claim 1, wherein the at least one internal oscillating heat pipe is integrally and wholly formed within the single body monolithic non-porous substrate to have a two-dimensional topology within the single body monolithic non-porous substrate.

5. The integrated circuit device of claim 1, wherein the at least one internal oscillating heat pipe is integrally and wholly formed within the single body monolithic non-porous substrate to have a three-dimensional topology within the single body monolithic non-porous substrate.

6. The integrated circuit device of claim 1, wherein the at least one internal oscillating heat pipe is integrally and wholly formed within the single body monolithic non-porous substrate to form a single fluid loop.

7. A method for fabricating an integrated circuit device, said method comprising:
   fabricating a single body monolithic non-porous substrate, wherein the fabricating of the single body monolithic non-porous substrate comprises integrally forming at least one internal oscillating heat pipe within the single body monolithic non-porous substrate such that the at least one internal oscillating heat pipe is integrally and wholly formed and enclosed, in its entirety, within the single body monolithic non-porous substrate, wherein the at least one internal oscillating heat pipe comprising at least one meandering multi-pass channel laterally extending throughout the entire single body monolithic non-porous substrate and having a closed loop design; and
   integrally forming at least one semiconductor device with the single body monolithic non-porous substrate such that the at least one semiconductor device has electrical continuity within the single body monolithic non-porous substrate and is thermally connected to the at least one internal oscillating heat pipe integrally and wholly formed and enclosed therewithin such that the at least one internal oscillating heat pipe is structured and operable to spread heat generated by the at least one semiconductor device, via motion of a working fluid within the at least one multi-pass channel, the motion generated by the heat from the at least one semiconductor device, away from the at least one semiconductor device, across one or more surfaces of the single body monolithic non-porous substrate, to minimize a maximum temperature of the entire integrated circuit device.

8. The method of claim 7 further comprising:
   forming at least one charge port in the single body monolithic non-porous substrate such that at least one port is fluidly connected to the at least one internal oscillating heat pipe such that the at least one internal oscillating heat pipe is fluidly connected to an environment exterior to the single body monolithic non-porous substrate;
   placing the single body monolithic non-porous substrate with the fluidly accessible at least one internal oscillating heat pipe into a chamber of known volume;
   evacuating the chamber of air;
   filling the chamber with a saturated working fluid;
   maintaining a temperature of chamber at a specified supercritical temperature for the working fluid for a specific period of time such that the saturated working fluid will enter the at least one internal oscillating heat pipe;
   controlling the entering of the working fluid into the at least one internal oscillating heat pipe such that a specific mass of the working fluid enters the at least one internal oscillating heat pipe to provide a desired fill fraction based on a volume of the at least one internal oscillating heat pipe and a density of working fluid; and sealing the at least one charge port such that the working fluid is sealed within the at least one internal oscillating heat pipe while the single body monolithic non-porous substrate remains within the chamber filled with the saturated working fluid at the specified supercritical temperature.

9. The method of claim 7, wherein the at least one internal oscillating heat pipe is formed within the single body monolithic non-porous substrate utilizing at least one of chemical etching, deep reactive ion etching, photo-chemical milling, mechanical milling, and additive manufacturing techniques.

10. The method of claim 7, wherein the at least one single body monolithic non-porous substrate is fabricated of at least one of Silicon, Silicon Carbide, Alumina, Aluminum Nitride, GaN, or GaAs.

11. The method of claim 7, wherein the at least one oscillating heat pipe is integrally and wholly formed within the single body monolithic non-porous substrate to have a two-dimensional topology within the single body monolithic substrate.

12. The method of claim 7, wherein the at least one oscillating heat pipe is integrally and wholly formed within the single body monolithic non-porous substrate to have a three-dimensional topology within the single body monolithic substrate.

13. The method of claim 7, wherein the at least one oscillating heat pipe is integrally and wholly formed within the single body monolithic non-porous substrate to form a single fluid loop.

* * * * *